United States Patent
Hsiao et al.

(10) Patent No.: US 11,784,455 B2
(45) Date of Patent: Oct. 10, 2023

(54) DIE LAYOUT CALCULATION METHOD, APPARATUS, MEDIUM, AND DEVICE

(71) Applicant: Changxin Memory Technologies, Inc., Anhui (CN)

(72) Inventors: Li-ming Hsiao, Hefei (CN); Chen Chen, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 155 days.

(21) Appl. No.: 17/401,049

(22) Filed: Aug. 12, 2021

(65) Prior Publication Data

US 2022/0075921 A1 Mar. 10, 2022

Related U.S. Application Data

(63) Continuation of application No. PCT/CN2021/101995, filed on Jun. 24, 2021.

(30) Foreign Application Priority Data

Sep. 9, 2020 (CN) .......................... 202010939198.5

(51) Int. Cl.
*H01S 5/00* (2006.01)
*H01S 5/02* (2006.01)
*G06F 30/392* (2020.01)

(52) U.S. Cl.
CPC .......... *H01S 5/0201* (2013.01); *G06F 30/392* (2020.01); *G05B 2219/37608* (2013.01); *G05B 2219/49002* (2013.01)

(58) Field of Classification Search
CPC .............. H01S 5/0201; G06F 30/392; G05B 2219/37608; G05B 2219/49002; G03F 7/70433; G03F 7/20; H01L 27/02
See application file for complete search history.

(56) References Cited

U.S. PATENT DOCUMENTS 5,699,260 A * 12/1997 Lucas ................. G03F 7/70433
430/311
6,368,761 B1 * 4/2002 Chien ................. G03F 7/70433
430/30

(Continued)

FOREIGN PATENT DOCUMENTS

CN 102656668 A 9/2012
CN 104205317 A * 12/2014 ....... H01L 21/67132

(Continued)

OTHER PUBLICATIONS

PCT International Search Report and the Written Opinion dated Sep. 28, 2021, issued in related International Application No. PCT/CN2021/101995, with English translation (13 pages).

(Continued)

*Primary Examiner* — Naum Levin
(74) *Attorney, Agent, or Firm* — Sheppard Mullin Richter & Hampton LLP

(57) ABSTRACT

A die layout calculation method is provided. The method includes: selecting, based on a distribution array of a plurality of dies in a wafer, one die as a reference die; making first movements of a wafer center to determine a first coverage region for each first movement, and determining a feasible region based on a number of complete dies in each first coverage region; making a plurality of second movements of the wafer center in the feasible region to determine a second coverage region for each second movement, and determining a relative position of the wafer center in the reference die corresponding to a maximum number of complete dies in the second coverage region; and determining a die layout comprising a location of each die in the wafer. This method improves the accuracy and efficiency of determining the maximum number of dies.

20 Claims, 12 Drawing Sheets

(56) References Cited

U.S. PATENT DOCUMENTS

| | | | |
|---|---|---|---|
| 7,033,847 B2* | 4/2006 | Tai | G03F 7/70433 |
| | | | 438/18 |
| 7,353,077 B2* | 4/2008 | Lin | H01L 22/20 |
| | | | 700/121 |
| 8,148,239 B2 | 4/2012 | Varela et al. | |
| 2003/0172365 A1 | 9/2003 | Fukagawa | |
| 2006/0191634 A1* | 8/2006 | Whitefield | H01L 21/02087 |
| | | | 156/345.1 |
| 2007/0027567 A1 | 2/2007 | Lin et al. | |
| 2012/0181669 A1 | 7/2012 | Lin et al. | |
| 2021/0103223 A1* | 4/2021 | Tee | G03F 7/70433 |
| 2021/0374316 A1* | 12/2021 | Xu | G06F 17/00 |

FOREIGN PATENT DOCUMENTS

| | | | | |
|---|---|---|---|---|
| CN | 112446887 A | * | 3/2021 | ......... G03F 7/70425 |
| EP | 0491375 A2 | | 6/1992 | |
| EP | 0854430 A2 | | 7/1998 | |
| TW | 200723356 A | | 6/2007 | |

OTHER PUBLICATIONS

PCT International Preliminary Report on Patentability dated Mar. 23, 2023, issued in related International Application No. PCT/CN2021/101995, with English translation (10 pages).

Extended European Search Report dated May 30, 2022, issued in related European Patent Application No. 21786071.7 (7 pages).

* cited by examiner

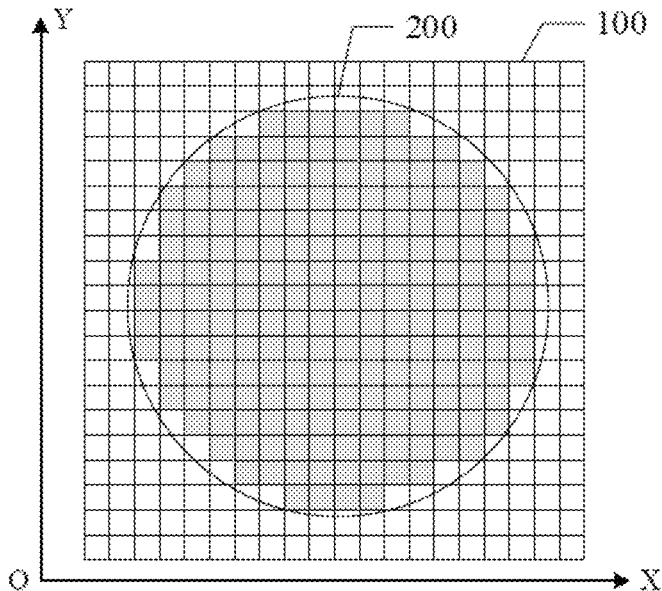

FIG. 2

| Make a plurality of first movements of the wafer center in the preset region of the reference die based on the first step by using one die in the distribution array of the plurality of dies as the reference die. | S310 |

| Determine, after each first movement, the first coverage region of the wafer based on the current location of the wafer center, and the quantity of complete dies in the first coverage region | S320 |

| Determine the location of the wafer center when the quantity of complete dies reaches a maximum value, and designate the wafer region formed by the wafer center as the feasible region | S330 |

FIG. 3

| A1 | A2 | A3 |
| --- | --- | --- |
| A4 | A5 | A6 |
| A7 | A8 | A9 |

DIE LAYOUT CALCULATION METHOD, APPARATUS, MEDIUM, AND DEVICE

CROSS-REFERENCE TO RELATED APPLICATIONS

This application is a continuation application of International Patent Application No.: PCT/CN2021/101995, filed on Jun. 24, 2021, which claims priority to Chinese Patent Application No.: 202010939198.5, filed on Sep. 9, 2020. The above-referenced applications are incorporated herein by reference in their entirety.

TECHNICAL FIELD

This invention relates to the field of semiconductor technologies, and in particular, to a die layout calculation method, apparatus, computer-readable storage medium, and electronic device.

BACKGROUND

Wafers are basic raw materials for manufacturing semiconductor devices. Each wafer may be cut into a plurality of dies. Each die may be manufactured into a chip through processes and procedures such as encapsulation and testing. Generally, before cutting a wafer, the maximum number of complete dies that can be obtained needs to be determined, so as to increase the die yield and reduce the manufacturing costs.

In existing techniques, the number X of complete dies that can be obtained by cutting a wafer is mainly calculated by using the following formula:

$$X = \frac{\text{wafer area}}{\text{die area}} - \frac{\text{wafer diameter}}{\text{die diagonal}}.$$

However, this formula can only provide an approximate number of dies that can be obtained by cutting the wafer, and there may be a relatively large discrepancy between the approximate number and the maximum number of dies that can be obtained by cutting the wafer in production. In some techniques, the number of complete dies in a wafer may be calculated by using a step search method. However, the calculation process is complex and time-consuming.

Therefore, a method that can quickly and accurately determine the die layout in a wafer is desirable.

The information disclosed in the background part is merely used to enhance the understanding of the background of this invention, and therefore may include information that does not constitute the prior art known to a person of ordinary skill in the art.

SUMMARY

Other features and advantages of this invention will become apparent in the following detailed description, or may be partially learned through practice of this invention.

One aspect of this invention is directed to a die layout calculation method. The method may include: selecting, based on a distribution array of a plurality of dies in a wafer, one die as a reference die; making, based on a first step and the distribution array of the plurality of dies, a plurality of first movements of a wafer center in a preset region of the reference die to determine a first coverage region of the wafer for each first movement, and determining a feasible region of the reference die based on a number of complete dies in the plurality of dies in each first coverage region; making, based on a second step, a plurality of second movements of the wafer center in the feasible region to determine a second coverage region of the wafer for each second movement, and determining, based on the second coverage regions, a relative position of the wafer center in the reference die, the relative position corresponding to a maximum number of complete dies in the second coverage regions; determining a selected die location from a plurality of adjacent die locations in a single-shot region, the selected die location corresponding to a minimum number of shots to cover all the dies on the wafer; and determining, based on the relative position of the wafer center and the selected die location in the single-shot region, a die layout of the wafer, the die layout comprising the location for each die of the plurality of dies in the wafer.

In some embodiments, determining a selected die location from a plurality of adjacent die locations in a single-shot region may include: determining, for each of the die locations in the single-shot region, a tentative number of shots to cover all the dies on the wafer; and selecting the die location with the smallest tentative number of shot as the selected die location.

In some embodiments, the method may further include determining the distribution array of the plurality of dies. The distribution array may be determined by: determining a pre-established two-dimensional coordinate system; and determining locations of the plurality of dies in the wafer based on the pre-established two-dimensional coordinate system and sizes of the dies to obtain the distribution array of the plurality of dies.

In some embodiments, making, based on a first step and the distribution array of the plurality of dies, a plurality of first movements of a wafer center in a preset region of the reference die to determine a first coverage region of the wafer for each first movement, and determining a feasible region of the reference die based on a number of complete dies in the plurality of dies in each first coverage region may include: making, based on the first step, the plurality of first movements of the wafer center in the preset region of the reference die; determining, for each first movement, a test location of the wafer center, and determining the first coverage region of the wafer based on the test location of the wafer center; determining, for each first coverage region, the number of complete dies in the first coverage region; designating one or more test locations of the wafer center corresponding to a maximum number of complete dies as the designated wafer centers; and designating a wafer region formed by the designated wafer centers as the feasible region.

In some embodiments, designating a wafer region formed by the designated wafer centers as the feasible region may include: in response to the designated wafer centers located in a straight line, designating a region comprising pixels with distances to the straight line less than a preset distance as the feasible region; or in response to at least three designated wafer centers located in different straight lines, designating a maximum encircling region formed by connecting the designated wafer centers as the feasible region.

In some embodiments, wherein the preset region of the reference die may be a ¼ rectangular region of the reference die. And making, based on a first step and the distribution array of the plurality of dies, a plurality of first movements of a wafer center in the preset region of the reference die may include: dividing the ¼ rectangular region into a plurality of sub-regions, each sub-region being a square having a side length equal to the first step; and making the plurality of first movements of the wafer center in the plurality of sub-regions based on the first step until all the sub-regions are traversed.

In some embodiments, making, based on a second step, a plurality of second movements of the wafer center in the feasible region to determine a second coverage region of the wafer for each second movement, and determining, based on the second coverage regions, a relative position of the wafer center in the reference die, the relative position corresponding to a maximum number of complete dies in the second coverage regions may include: dividing the feasible region into a plurality of grids each having a side length equal to the second step; making the plurality of second movements of the wafer center in the plurality of grids based on the second step; and determining, for each second movement, the second coverage region of the wafer based on a current location of the wafer center, and determining the relative position of the wafer center, the relative position corresponding to the maximum number of complete dies in the second coverage region.

In some embodiments, making the plurality of second movements of the wafer center in the plurality of grids based on the second step may include: determining one grid of the plurality of grids in the feasible region as an initial location of the wafer center, and making the second movements of the wafer center in a clockwise direction or a counterclockwise direction in the plurality of grids based on the second step; and, after each second movement: determining the second coverage region based on the current location of the wafer center, and determining a current number of complete dies in the second coverage region; comparing the current number of completed dies with an initial number of completed dies corresponding to the initial location of the wafer center; and, in response to the current number of completed dies larger than or equal to the initial number of completed dies, designating the grid corresponding to the current number of completed dies as the initial location of the wafer center.

In some embodiments, the method may further include, after determining the relative position of the wafer center, determining valid dies in the complete dies; determining a die coverage region for the valid dies; determining, in the die coverage region, a number of valid edge dies and a number of valid non-edge dies in the valid dies; and determining a maximum number of valid dies, wherein the maximum number of valid dies is a sum of the number of valid non-edge dies and a product of the number of valid edge dies with a preset constant.

In some embodiments, determining, based on the relative position of the wafer center and the selected die location in the single-shot region, a die layout of the wafer may include: determining a target coverage region of the wafer and the location of each die in the target coverage region based on the maximum number of complete dies and the minimum number of shots to generate the die layout; or determining a target coverage region of the wafer and the location of each die in the target coverage region based on the maximum number of valid dies and the minimum number of shots, to generate the die layout.

In some embodiments, there may be a plurality of target coverage regions. And the method may further include: determining, for each target coverage region, a regional edge at which a complete die or a valid die is located in each target coverage region; comparing, for each target coverage region, a distance between the regional edge and a wafer edge, to determine the largest distance between the regional edge and the wafer edge; determining the target coverage region corresponding to the largest distance as an optimal wafer coverage region; and determining locations of all the complete dies or locations of all the dies in the wafer in the optimal wafer coverage region, to generate the die layout.

Another aspect of this invention is directed to a die layout calculation apparatus. The apparatus may include: a first movement module, a second movement module, a determining module, and a generation module.

The first movement module may be configured to select, based on a distribution array of a plurality of dies in a wafer, one die of the plurality dies in the wafer as a reference die; and make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region.

The second movement module may be configured to make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the second coverage regions.

The determining module may be configured to determine a selected die location from a plurality of die locations in a single-shot region, the selected die location corresponding to a minimum number of shots to cover all the dies on the wafer.

The generation module may be configured to determine, based on the relative position of the wafer and the selected die location in the single-shot region, a die layout of the wafer, the die layout comprising the location for each die of the plurality of dies in the wafer.

In some embodiments, the first movement module may be further configured to determine the distribution array of the plurality of dies. The distribution array may be determined by: determining a pre-established two-dimensional coordinate system; and determining locations of the plurality of dies in the wafer based on the pre-established two-dimensional coordinate system and sizes of the dies to obtain the distribution array of the plurality of dies.

In some embodiments, to make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region, the first movement module may be further configured to: make, based on the first step, the plurality of first movements of the wafer center in the preset region of the reference die; determine, for each first movement, a test location of the wafer center, and determine the first coverage region of the wafer based on the test location of the wafer center; determine, for each first coverage region, the number of complete dies in the first coverage region; designate one or more test locations of the wafer center corresponding to a maximum number of complete dies as the designated wafer centers; and designate a wafer region formed by the designated wafer centers as the feasible region.

In some embodiments, the preset region of the reference die may be a ¼ rectangular region of the reference die. And to make, based on a first step and the distribution array of the plurality of dies, a plurality of first movements of a wafer center in the preset region of the reference die, the first movement module may be further configured to: divide the ¼ rectangular region into a plurality of sub-regions, each sub-region being a square having a side length equal to the first step; and make the plurality of first movements of the wafer center in the plurality of sub-regions based on the first step until all the sub-regions are traversed.

In some embodiments, to designate a wafer region formed by the designated wafer centers as the feasible region, the first movement module may be further configured to: in response to the designated wafer centers located in a straight line, designate a region comprising pixels with distances to the straight line less than a preset distance as the feasible region; or in response to at least three designated wafer centers located in different straight lines, designate a maximum encircling region formed by connecting the designated wafer centers as the feasible region.

In some embodiments, to make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the plurality of dies in the second coverage regions, the second movement module may be further configured to: divide the feasible region into a plurality of grids each having a side length equal to the second step; make the plurality of second movements of the wafer center in the plurality of grids based on the second step; and determine, for each second movement, the second coverage region of the wafer based on a current location of the wafer center, and determine the relative position of the wafer center, the relative position corresponding to the maximum number of complete dies in the second coverage region.

In some embodiments, to make the plurality of second movements of the wafer center in the plurality of grids based on the second step, the second movement module may be further configured to: determine one grid of the plurality of grids in the feasible region as an initial location of the wafer center, and make the second movements of the wafer center in a clockwise direction or a counterclockwise direction in the plurality of grids based on the second step; and after each second movement: determine the second coverage region based on the current location of the wafer center, and determine a current number of complete dies in the second coverage region; compare the current number of completed dies with an initial number of completed dies corresponding to the initial location of the wafer center; and in response to the current number of completed dies larger than or equal to the initial number of completed dies, designate the grid corresponding to the current number of completed dies as the initial location of the wafer center.

Another aspect of this invention is directed to a computer-readable storage medium. The medium may store a computer program executable by a processor. Upon being executed by a processor, the computer program may cause the processor to perform any of the foregoing die layout calculation methods for a wafer.

Another aspect of this invention is directed to an electronic device. The device may include: a processor; and a memory. The memory may be configured to store executable instructions of the processor. The processor may be configured to perform any of the foregoing die layout calculation methods for a wafer by executing the executable instruction.

The foregoing general descriptions and the following detailed descriptions are merely examples and explanations, and do not intend to limit this invention.

BRIEF DESCRIPTION OF THE DRAWINGS

The accompanying drawings illustrate embodiments in accordance with this invention, and are used to explain the principle of this invention. Apparently, the accompanying drawings in the following description illustrate merely some embodiments of this invention, and a person of ordinary skill in the art may derive other accompanying drawings from these accompanying drawings without creative efforts.

FIG. 2 is a schematic diagram of a distribution array according to an embodiment of the present invention.

FIG. 3 is a sub-flowchart of a die layout calculation method for a wafer according to an embodiment of the present invention.

DETAILED DESCRIPTION OF THE EMBODIMENTS

The exemplary implementations of this invention are comprehensively described with reference to the accompanying drawings. The present invention can be implemented in a plurality of manners, and is not limited to the exemplary implementations described herein. Providing these implementations makes this invention more comprehensive and complete, and the concepts of the exemplary implementations are comprehensively conveyed to a person skilled in the art. In addition, the described features, structures, or characteristics may be combined in one or more implementations in any proper manner.

In a semiconductor device manufacturing process, a die layout on a wafer may first be determined. The die layout may include grids of squares or rectangles, each representing the location of a die to be manufactured on the wafer. Then, on each location of the die on the wafer, identified by the die layout, a die may be manufactured, including using one or more lithography processes performed by a lithography device. In the lithography process, the lithography device may etch the wafer using light of a certain wavelength to essentially "print" predetermined circuit patterns on the wafer to form a die. Typically, a lithography device may process only a small portion of the wafer at one time. Therefore, multiple manufacturing processes are needed to process the entire wafer. In this specification, the manufacturing process performed on portion of the wafer to "print" the dies on that portion of the wafer may be referred to as a "shot", and the portion of wafer that can be processed one time (i.e., a single shot) may be referred to as a "single-shot region."

To improve the throughput of the semiconductor manufacturing process, the number of dies that can be manufactured on one wafer, known as Gross Die Per Wafer (GPDW) needs to be as high as possible, and the number total shots needed to process the entire wafer needs to be as small as possible.

Figure 1:
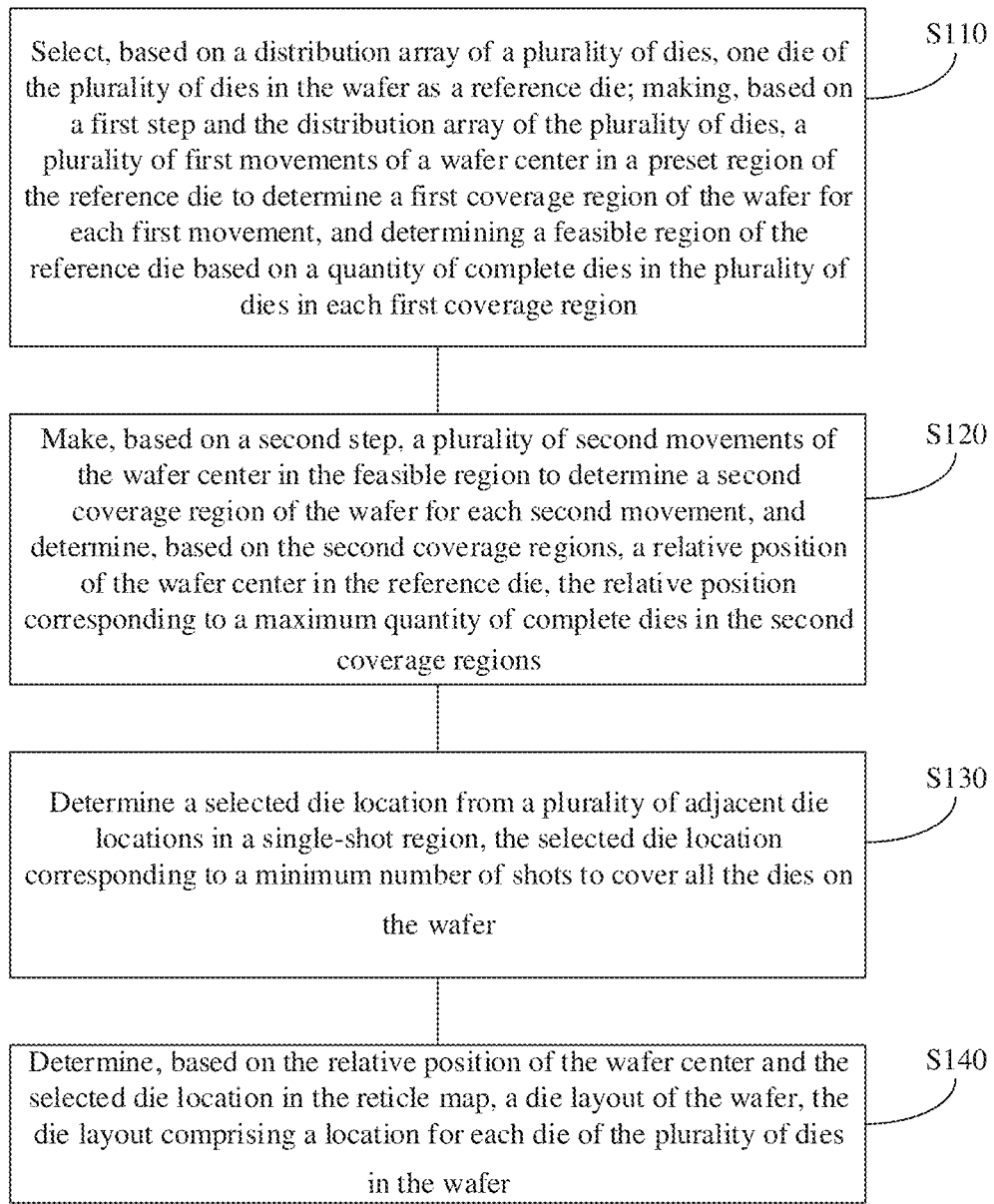
FIG. 1 is a flowchart of a die layout calculation method for a wafer according to an embodiment of the present invention.

This invention first presents a die layout calculation method for a wafer. FIG. 1 is a flowchart of a die layout calculation method for a wafer according to an embodiment of the present invention. Referring to FIG. 1, the method may include the following steps S110 to S140.

In step S110, one die of a plurality of dies in the wafer may be selected as a reference die based on the distribution array of the plurality dies. Then, based on a first step and the distribution array of the plurality of dies, a plurality of first movements of a wafer center may be made.

The plurality of first movements of the wafer center may be made in a preset region of the reference die. A first coverage region of the wafer may be determined for each first movement, and a feasible region of the reference die may be determined based on a number of complete dies in the plurality of dies in each first coverage region.

The distribution array of the plurality of dies in the wafer may indicate the initial locations of the dies in the wafer. The reference die may be one die of the plurality of dies configured to be the location reference in the distribution array. The reference die may be any die in the distribution array.

The first step may be a distance of each first movement of the wafer center in the reference die. Generally, the first step may in a range from 10 μm to 100 μm. In some embodiments, the first step may be in a range 10 μm to 50 μm. Specifically, the first step may be set to 20 μm.

The preset region may be any region of the reference die. Particularly, based on the structural symmetry of the reference die, the preset region may include only a symmetric region in the reference die. The first coverage region for each first movement may be a region in which the distribution array of the dies overlaps a circular region. The center of the circular region may be the wafer center after the first movement, and a radius of the circular region may be the wafer radius.

FIG. 2 is a schematic diagram of a distribution array according to an embodiment of the present invention. Referring to FIG. 2, in the distribution array 100 of the dies, the region 200 enclosed by a circle is the first coverage region. The complete die may be a die in the distribution array of the dies that is completely within the first coverage region without any missing portion (e.g., the grey squares shown in FIG. 2). The feasible region of the reference die may be a region in which a maximum number of complete dies can be obtained.

In some embodiments, to determine the distribution array of the plurality of dies, a pre-established two-dimensional coordinate system may first be determined. Then, the locations of the dies in the wafer may be determined based on the pre-established two-dimensional coordinate system and the sizes of the dies.

Referring to FIG. 2, the two-dimensional coordinate system may be a coordinate system that uses an X-axis as the horizontal axis and a Y-axis as the vertical axis. A single die may be presented as a square (or a rectangle) with a determined side length. Based on the size of the die, such as the side length, the distribution array 200 of the dies may be determined in the two-dimensional coordinate system. The location of each die, such as the coordinates of a die center, in the distribution array may also be determined. In a wafer cutting process, for ease of cutting, each row of dies and each column of dies are arranged aligning with each other. In addition, to obtain the maximum number of dies by cutting the wafer, a small cutting gap may be allocated between adjacent dies.

One die may be selected from the distribution array of the plurality of dies as the reference die. The wafer center may be disposed in the preset region of the reference die. As the wafer center moves to different locations in the preset region of the reference die, the corresponding numbers of complete dies in the first coverage regions of the wafer may vary. Therefore, to determine the location of the wafer center in the preset region that leads to the maximum number of complete dies, the wafer center may be moved in the preset region of the reference die based on the first step. After each movement, the first coverage region of the wafer may be determined, and the number of complete dies in the first coverage region may be calculated to determine the feasible region of the reference die. In this specification, the above movement of the wafer center based on the first step may be referred to as "the first movement."

In some embodiments, in step S110, when making the first movements of the wafer center in the preset region of the reference die based on the first step, one or more locations of the wafer center that result in a maximum number of complete dies in the preset region may first be determined. Then, the feasible region may be determined based on the one or more locations of the wafer center.

FIG. 3 is a sub-flowchart of a die layout calculation method for a wafer according to an embodiment of the present invention. Referring to FIG. 3, the sub-flowchart may include the following steps S310 to S330.

In step S310, a plurality of first movements of the wafer center may be made in the preset region of the reference die based on the first step by using one die in the distribution array of the plurality of dies as the reference die.

In step S320, after each first movement, the first coverage region of the wafer may be determined based on the current location of the wafer center, and the number of complete dies in the first coverage region may be determined.

In step S330, when the number of complete dies reaches a maximum value, the location of the wafer center may be determined, and the wafer region formed by the wafer center may be determined as the feasible region.

In the preset region of the reference die, using any location (e.g., the upper left corner of the reference die) as a starting point, the wafer center may move in a determinate direction based on the first step. After each first movement, a circular region, which is referred to as "the first coverage region," may be determined.

The circle center of the first coverage region may be the current location of the wafer center (i.e., the location of the wafer center after this first movement) and the radius of the first coverage region may be the wafer radius. Then, the number of complete dies in the first coverage region, (i.e., the number of complete dies that fall within the circular region) may be determined. In this manner, the number of complete dies in the first coverage region of the wafer after each first movement of the wafer center may be determined, so that when a maximum value of the number of complete dies is obtained, the location of the wafer center corresponding to the maximum value may be determined. One or more locations of the wafer center may correspond to the maximum value of the number of complete dies. The region (i.e., the first coverage region) corresponding to the one or more locations of the wafer center may be designated as the feasible region.

Figure 4:
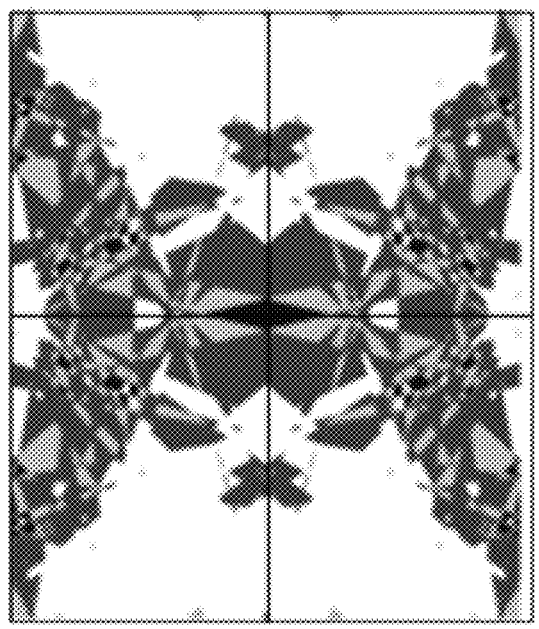
FIG. 4 is a schematic diagram of a die structure according to an embodiment of the present invention.

The numbers of complete dies that can be obtained in the wafer with the wafer center at different locations in a die may follow a certain regularity. FIG. 4 is a schematic diagram of a die structure according to an embodiment of the present invention. Referring to FIG. 4, when the wafer center is located in block regions the same greyscale in the die, the numbers of complete dies that can be obtained in a single wafer is the same. Correspondingly, when the wafer center is located in block regions of different greyscales, the numbers of complete dies that can be obtained in a single wafer may be different. In addition, in the entire die region, the distribution of greyscales corresponding to the numbers of complete dies shows symmetrical characteristics both longitudinally and bilaterally. Therefore, to decrease the calculation amount and improve the efficiency of determining the feasible region, in some embodiments, the preset region may be a ¼ rectangular region of the reference die.

Figure 5:
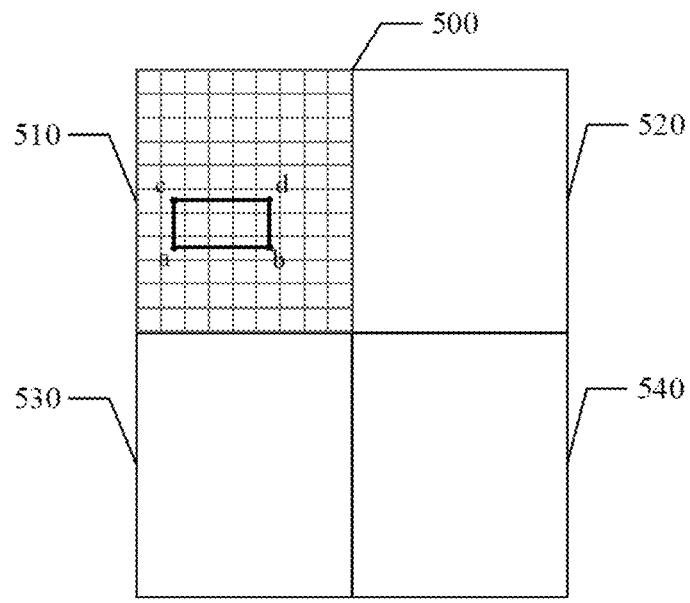
FIG. 5 is a schematic diagram of a region of a reference die according to an embodiment of the present invention.

FIG. 5 is a schematic diagram of a region of a reference die according to an embodiment of the present invention. Referring to FIG. 5, the ¼ rectangular regions 510, 520, 530, and 540 of the reference die 500 may be regions at the upper left corner, upper right corner, lower left corner, and lower right corner of the reference die 500, respectively. The foregoing method for moving the wafer center in the preset region of the reference die based on the first step may be implemented in the following manner: dividing one ¼ rectangular region of the reference die into a plurality of sub-regions, each sub-region being a square with side length equal to the first step; and moving the wafer center in the plurality of sub-regions based on the first step until all the sub-regions are traversed.

Referring to FIG. 5, one ¼ rectangular region of the reference die 500 may be divided into a plurality of sub-regions. Take the rectangular region 510 as an example, the rectangular region 510 may be divided into a plurality of sub-regions. Each sub-region may be a square whose side length is equal to the first step. When making the first movements based on the first step, any location in one sub-region (e.g., the center of the sub-region) may be used as a starting point, and the wafer center may be sequentially moved from the starting point.

After each first movement, the first coverage region may be determined based on the current location of the wafer center (i.e., the location of the wafer center after this first movement), and the number of complete dies in the first coverage region may be determined. Multiple first movements may be made until all the sub-regions are visited. The maximum number of complete dies may be determined based on the corresponding number of complete dies when the wafer center is in each sub-region, and the feasible region may be determined based on each location of the wafer center corresponding to the maximum number. For example, as shown in FIG. 5, when the maximum value of the number of complete dies is obtained, the locations of the wafer center corresponding to the maximum value may be a, b, c, and d, and the rectangular region 520 formed by a, b, c, and d may be designated as the feasible region of the reference die.

In the reference die, there may be multiple locations of the wafer center corresponding to the maximum number of complete dies, and the relative positions between these locations may vary. Therefore, in some embodiments, the feasible region may be determined in the following manner: when the locations of the wafer center corresponding to the maximum number of complete dies are located in a straight line, a region comprising pixels with distances to the straight line less than a preset distance may be designated as the feasible region. Alternatively, when at least three of the locations of the wafer center corresponding to the maximum number of complete dies are located in different straight lines, a maximum encircling region formed by connecting these locations may be designated as the feasible region.

Generally, the preset distance may be set based on the value of the first step. In one example, the first step may be in a range of 10 μm to 100 μm, and may further be in a range of 10 μm to 50 μm. Specifically, the first step may be set to 20 μm. Correspondingly, the preset distance may be in a range of 5 μm to 50 μm, and may further be in a range of 5 μm to 20 μm. Specifically, the preset distance may be set to 10 μm.

The maximum encircling region may be a region formed by the wafer centers. For example, the maximum encircling region may be obtained by connecting the locations of the wafer center. In one example, as shown in FIG. 5, the maximum encircling region may be the rectangular region formed by connecting the locations of the wafer center a, b, c, and d. Alternatively, the maximum encircling region may be a region comprising pixels having distances to the lines connecting the wafer centers less than the preset distance.

Figure 6A:
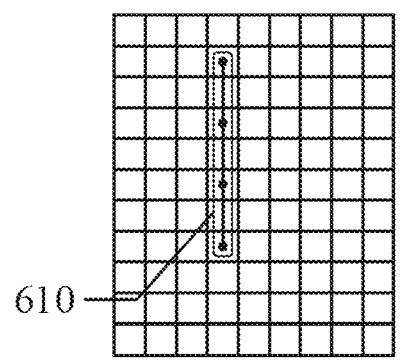
FIGS. 6A and 6B are schematic diagrams of a feasible region according to an embodiment of the present invention.
Figure 6B:
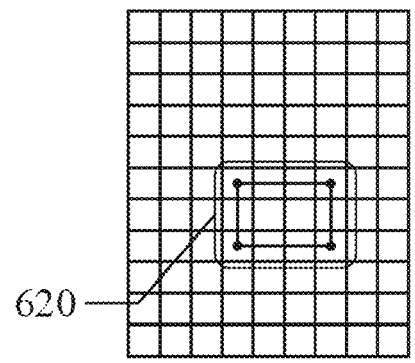

FIGS. 6A and 6B are schematic diagrams of a feasible region according to an embodiment of the present invention. As shown in FIG. 6A, in one example, locations of the wafer center corresponding to the maximum number of complete dies are located in a straight line. In this case, the feasible region may be the region 610 comprising pixels having distances to the straight line less than the preset distance.

As shown in FIG. 6B, in another example, at least three of the locations of the wafer center corresponding to the maximum number of complete dies may be located in different straight lines. In this case, the feasible region may be a maximum encircling region formed by connecting the locations of the wafer center. As shown in FIG. 6B, the maximum encircling region 620 formed by the locations of the wafer center may be the region comprising pixels having distances to the straight lines connecting the locations of the wafer center less than the preset distance.

In addition, when dividing the ¼ rectangular region of the reference die into a plurality of sub-regions, the size of each sub-region may be set based on actual needs. The smaller the size of the sub-region, the larger the number of the sub-regions. Correspondingly, with a smaller sub-region, the searching precision may get higher, the obtained feasible region may get smaller, and the calculation time may get longer. On the other hand, the larger the size of the sub-region, the smaller the number of the sub-regions. Correspondingly, with a larger sub-region, the searching precision may get lower, the range of the obtained feasible region may get larger, and the calculation time may get shorter.

In step S110, the preset region of the reference die may be searched based on the first step, and the feasible region of the reference die may be determined. Since the preset region of the reference die may include only a partial region of the reference die, the calculation amount and time of determining the feasible region may be greatly decreased.

In step S120, based on a second step, a plurality of second movements of the wafer center may be made in the feasible region to determine a second coverage region of the wafer for each second movement. Based on the second coverage regions, a relative position of the wafer center in the reference die may be determined. The relative position may correspond to a maximum number of complete dies in the second coverage regions.

The second step may be smaller than the first step. Generally, the second step may be in a range of 0.1 μm to 10 μm, and may be specifically set based on actual needs.

The second coverage region may be a circular region formed after each second movement of the wafer center based on the second step. The circle center of the circular region may be the wafer center after the second movement, and the radius of the circular region may be the wafer radius. That is, the second coverage region may be a region in which the wafer, with the wafer center updated after each second movement, overlaps the distribution array of the dies.

After the feasible region is determined, the feasible region may be further searched to determine a precise location of the wafer center corresponding to the maximum number of complete dies. Specifically, a plurality of second movements of the wafer center may be made in the feasible region based on the second step. After each second movement, the corresponding second coverage region may be determined based on the location of the wafer center, and the number of complete dies in each second coverage region may be calculated to determine the locations of the wafer center corresponding to the maximum number of complete dies.

To improve the efficiency of determining the maximum number of complete dies in the second coverage region, in some embodiments, the feasible region may be searched by using a boundary tracing method.

Figure 7:
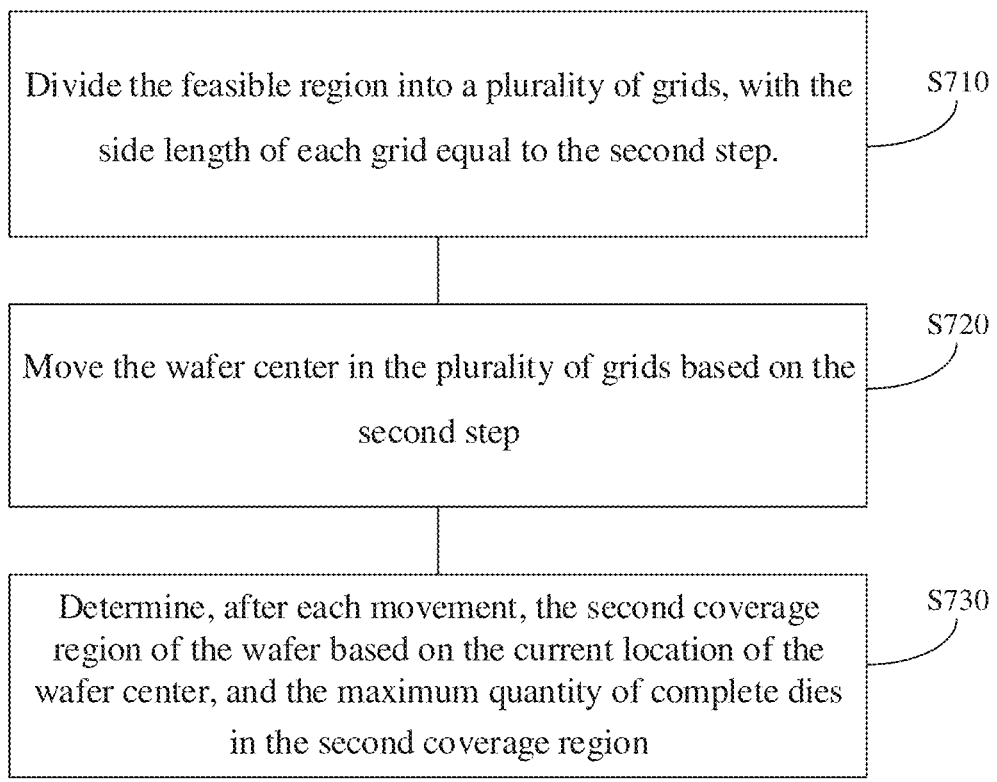
FIG. 7 is a sub-flowchart of another die layout calculation method for a wafer according to an embodiment of the present invention.

FIG. 7 is a sub-flowchart of another die layout calculation method for a wafer according to an embodiment of the present invention. Referring to FIG. 7, the sub-flowchart may include steps S710 to S730.

In step S710, the feasible region may be divided into a plurality of grids. The side length of each grid may be equal to the second step.

In step S720, the wafer center may be moved in the plurality of grids based on the second step.

In step S730, after each movement, the second coverage region of the wafer may be determined based on the current location of the wafer center, and the maximum number of complete dies in the second coverage region may be determined.

The feasible region may be divided into a plurality of grids, and the side length of each grid may be equal to the second step. For example, the side length may be set to 1 μm. Using any location in one grid (e.g., the center of the grid) as an initial location, the wafer center may be moved in the feasible region based on the second step. A boundary tracing algorithm, such as a Moore-neighbor boundary tracing algorithm, may be used. After each movement, the second coverage region of the wafer corresponding to this movement may be determined. Then, the maximum number of complete dies in the region may be determined.

In some embodiments, step S720 may be implemented in the following method: determining, in the plurality of grids, one grid in the feasible region as an initial location of the wafer center, and moving the wafer center in a clockwise direction or a counterclockwise direction in the plurality of grids based on the second step; after each movement, determining the second coverage region based on the current location of the wafer center, and determining a current number of complete dies in the second coverage region; comparing the current number of completed dies with an initial number of completed dies corresponding to the initial location of the wafer center; and in response to the current number of completed dies larger than or equal to the initial number of completed dies, designating the grid corresponding to the current number of completed dies as the initial location of the wafer center.

Figure 8:
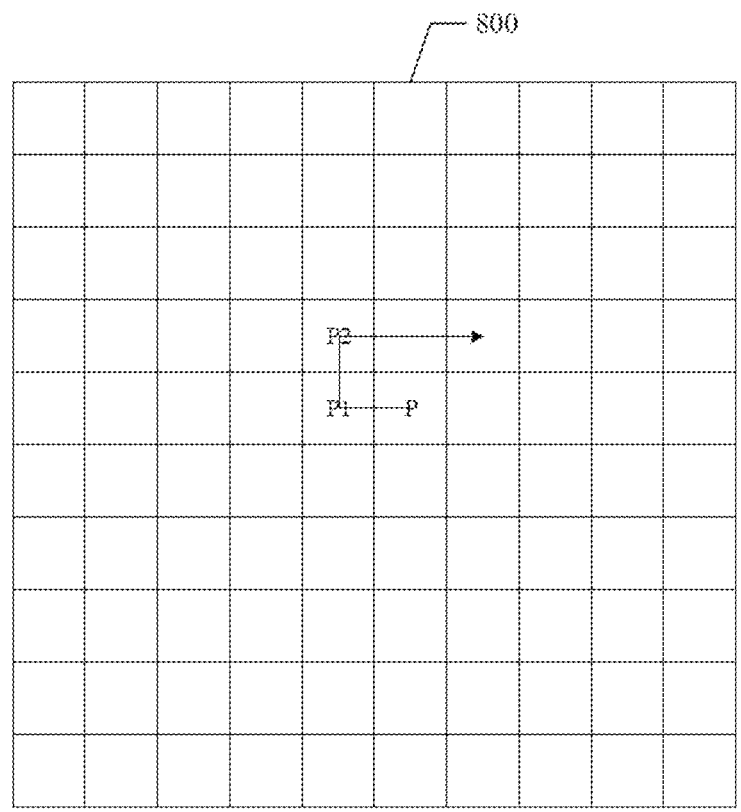
FIG. 8 is a schematic diagram of a wafer center movement method according to an embodiment of the present invention.

FIG. 8 is a schematic diagram of a wafer center movement method according to an embodiment of the present invention. Referring to FIG. 8, the feasible region 800 may be divided into a plurality of grids. Using any location in one grid (e.g., each vertex of the grid, or any location in the grid such as the center of the grid) in the feasible region as an initial location, the wafer center may be moved in a clockwise direction or a counterclockwise direction based on the second step.

In the example shown in FIG. 8, point P may be used as the initial location. The second coverage region of the wafer corresponding to point P and the number of complete dies in the second coverage region may be determined. Then, the wafer center may be moved in the clockwise direction based on the second step. After one movement, the location of the wafer center may be P1. Then, the second coverage region of the wafer corresponding to point P1 may be determined to obtain the current number of complete dies. The current number of complete dies may be compared with the number of complete dies when the wafer center is at the previous location (i.e., the initial location P). If the current number of complete dies is greater than or equal to the number of complete dies when the wafer center is at the initial location P, the location of the wafer center P1 (i.e., the location of the wafer center after one movement) may be designated as the new initial location. Then, the wafer center may be moved again in the clockwise direction based on the second step.

If the current number of complete dies is less than the number of complete dies when the wafer center is at the initial location P, the initial location may not be updated. The wafer center may continue to be moved in the clockwise direction to point P2, and the current number of complete dies corresponding to point P2 may be determined. The current number of complete dies obtained when the wafer center is at point P2 may be compared with the number of complete dies when the wafer center is at the initial location. If the current number of complete dies obtained when the wafer center is at point P2 is greater than or equal to the number of complete dies when the wafer center is at the initial location, point P2 may be designated as the new initial location. Otherwise, the wafer center may continue to be moved in the clockwise direction to point P3, and the foregoing determining process may be performed again.

The grids may be searched in the above manner, and the search may stop after all the grids are searched in the clockwise direction or the counterclockwise direction from a certain initial location, and the number of complete dies is not greater than or equal to the number of complete dies when the wafer center is at the initial location. In this case, the initial location may be determined as the location of the wafer center corresponding to the maximum number of complete dies. By using the above search manner, the location of the wafer center corresponding to the maximum number of complete dies may be further determined in the feasible region.

Figure 9:
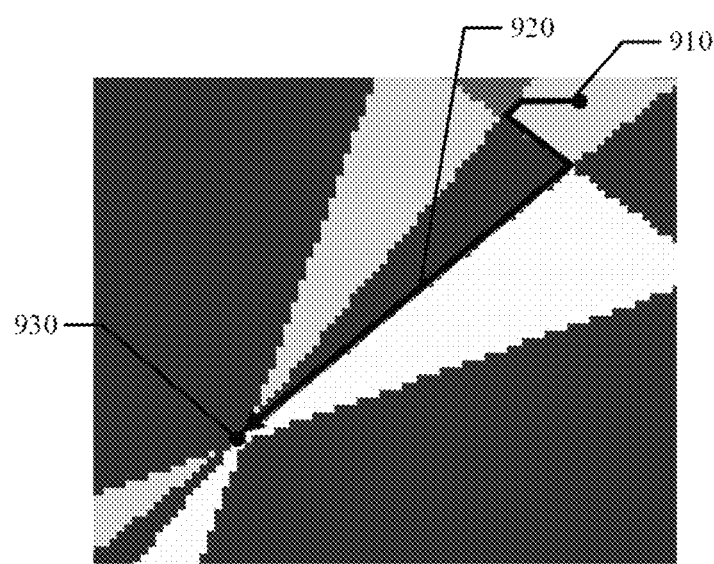
FIG. 9 is a schematic diagram of a boundary search method according to an embodiment of the present invention.

FIG. 9 is a schematic diagram of a boundary search method according to an embodiment of the present invention. Referring to FIG. 9, when searching the location of the wafer center corresponding to the maximum number of complete dies by using the boundary tracing algorithm, point 910 may be used as the initial location. Each location of the wafer center corresponding to the maximum number of complete dies may be determined by using the boundary tracing algorithm. The boundary tracing algorithm may find Point 930 of the wafer center corresponding to the maximum number of complete dies. The locations of the wafer center after each search may form the searching path 920. In this manner, the maximum number of complete dies and each location of the wafer center corresponding to the maximum number of complete dies may be determined in the feasible region.

Since the yield of the dies on the wafer edge is relatively low, after the maximum number of complete dies in the wafer is determined, a maximum number of valid dies in the wafer may be determined.

In some embodiments, the maximum number of valid dies may be determined in the following method: determining the die coverage region of all valid dies in all the complete dies; determining the number of valid edge dies and the number of valid non-edge dies of the wafer in the die coverage region; calculating the product of the number of valid edge dies with a preset constant; and designating the sum of the product and the number of valid non-edge dies as the maximum number of valid dies.

In the manufacturing process of a wafer, dies at the edge of the wafer may have an extremely low yield due to the manufacturing process, and may be considered invalid dies. Dies in the interior region of the wafer may have a relatively high yield, and may be considered as valid dies.

After the maximum number of complete dies in the wafer is determined, the die coverage region of all the valid dies (i.e., the interior region of the wafer), may be determined, and the number of valid edge dies and the number of valid non-edge dies of the wafer may be determined in the die coverage region. After the valid dies of the wafer in the interior region are determined, since the dies of the wafer close to the edge of the central region may have a lower yield than those at the interior region, a coefficient k may be introduced when calculating the number of dies. The number may be computed based on the formula: the maximum number of valid dies=number of valid edge dies×k+number of valid non-edge dies, where 0<k<1, to obtain an optimal die layout method. The specific value of k may be obtained based on the yield distribution pattern of the wafer in the actual production process.

Figures 10, 11:
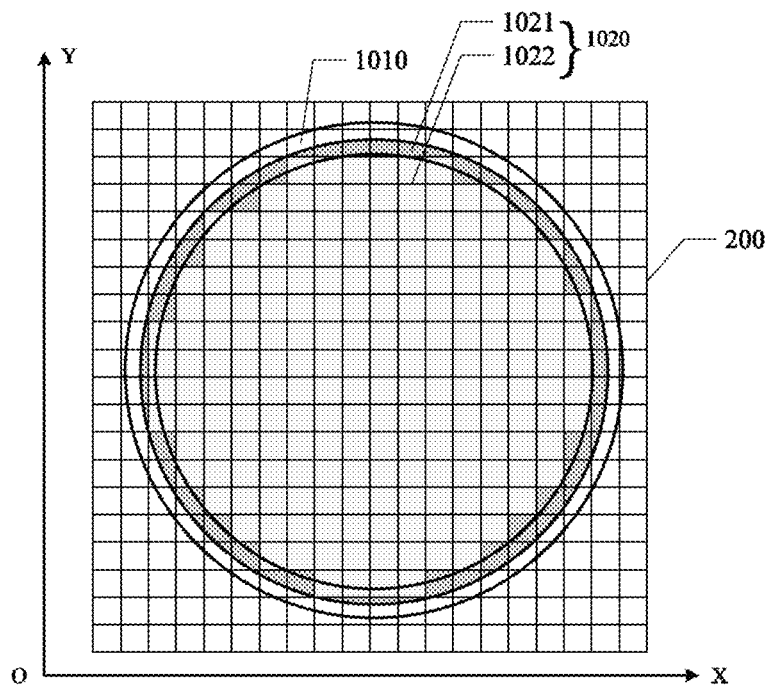
FIG. 10 is a schematic diagram of a valid edge die and a valid non-edge die according to an embodiment of the present invention.
FIG. 11 is a schematic diagram of a die location distribution pattern according to an embodiment of the present invention.

FIG. 10 is a schematic diagram of a valid edge die and a valid non-edge die according to an embodiment of the present invention. Referring to FIG. 10, the wafer may include an edge region 1010 and an interior region 1020. A die in the edge region 1010 of the wafer may be an invalid die. The interior region 1020 may include a valid edge die region 1021 and a valid non-edge die region 1022. The yield coefficient of a die in the valid non-edge die region 1022 is 1.

A valid die in the valid edge die region 1021 may be a valid edge die. The maximum number of all valid dies may be obtained by first multiplying the number of valid edge dies by a coefficient less than 1, and then adding the multiplication result to the number of valid non-edge dies.

In some embodiments, a die locating at the boundary between the interior region 1020 and the edge region 1010 of the wafer may be considered as an invalid die, and a die locating at the boundary between the valid non-edge die region 1022 and the valid edge die region 1021 may be considered as a valid edge die. In some embodiments, other classifications of the dies and computation methods may be adapted based on actual needs.

Through steps S110 and S120, the feasible region may be determined, and the maximum number of complete dies may be further determined in the feasible region. Compared with the conventional step search methods, the method discloses herein substantially improves the efficiency of determining the maximum number of complete dies.

In step S130, after the maximum number of complete dies is determined, a selected die location from a plurality of adjacent die locations in a single-shot region may be determined. The selected die location may correspond to a minimum number of shots to cover all the dies on the wafer The single-shot region may be a die region that can be printed by the lithography device at one time. The die location distribution pattern may be a die distribution pattern when the lithography device performs one shot.

FIG. 11 is a schematic diagram of a die location distribution pattern according to an embodiment of the present invention. Referring to FIG. 11, the single-shot region may include nine die locations distributed in an array, and the array distribution pattern may be the die location distribution pattern in the single-shot region of the lithography device. As shown in FIG. 11, the lithography device may print nine dies distributed in the array at a time. The dies may include all complete dies and incomplete dies in the wafer.

In the semiconductor manufacturing process, after the maximum number of complete dies and the location of each complete die in the wafer are determined, the wafer may be cut based on the location of each die in the wafer. In this case, a shot may be referred to a process to "print" the die pattern to the wafer by etching the wafer with light. Since the size of a wafer is relatively large and only a few dies can be printed to the wafer in one shot of the lithography device, it is rare that all the dies in the wafer can be printed to the wafer in one shot. Therefore, the wafer usually may need to go through multiple shots to cover all the dies.

In some embodiments, after the maximum number of complete dies is determined, to determine the minimum number of shots to cover all the dies, the reference die may be sequentially placed at different die locations in the single-shot region of the lithography device based on the die location distribution pattern in the single-shot region.

As shown in FIG. 11, the reference die may be sequentially placed at locations A1, A2, . . . , and A9 to obtain nine different shot schemes. The number of shots to cover all the dies in each shot scheme may be calculated to obtain the minimum number of shots to cover all the dies. The shot scheme corresponding to the minimum number of shots may be the preferred scheme to cover all the dies.

Figure 12A:
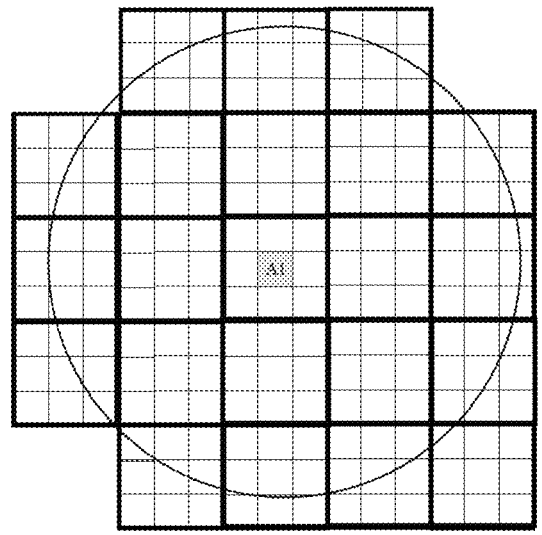
FIGS. 12A and 12B are schematic diagrams of a shot scheme according to an embodiment of the present invention.
Figure 12B:
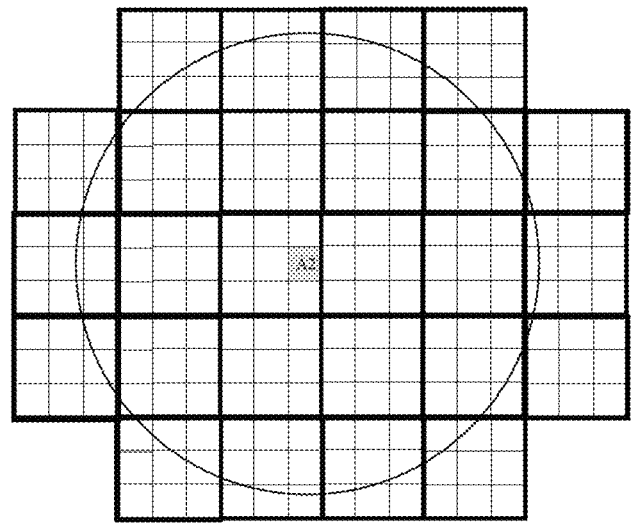

FIGS. 12A and 12B are schematic diagrams of a shot scheme according to an embodiment of the present invention. Referring to FIG. 12A, each thick-line box in the figure may include nine dies, and may represent a single-shot region that can be covered at one time. When the reference die is at location A1 in the single-shot region, the wafer may need to be printed 22 times to cover all the dies in the wafer.

Referring to FIG. 12B, when the reference die is at location A2 in the single-shot region, the wafer may need to be printed 26 times to cover all the dies in the wafer. When the locations of the reference dies are different, the required numbers of shots to cover all the dies may be different. Determining the minimum number of shots of the lithography device can greatly decrease the shot time and shot costs.

In step S140, based on the relative position of the wafer center and the selected die location in the single-shot region, a die layout of the wafer may be determined. The die layout may include the location for each die of the plurality of dies in the wafer.

The die layout may be a distribution of all dies that can be obtained by cutting the wafer. The die layout may include the locations of all the complete dies, or the locations of all the dies.

After the maximum number of complete dies and the minimum number of shots to cover all the dies, the locations of the dies may be determined, and the die layout of the wafer may be determined based on the locations of the dies. When the wafer is cut based on the die layout, the maximum number of complete dies may be achieved, and a minimum number of shots is needed to cover all the dies is. Therefore, the manufacturing costs can be reduced while ensuring the largest yield.

In some embodiments, step S140 may be implemented by determining a target coverage region of the wafer and the location of each die in the target coverage region based on the maximum number of complete dies and the minimum number of shots to cover all the dies to determine the die layout of the wafer based on the locations of the dies. The locations of the dies may be the locations of all the complete dies in the wafer or the locations of all the dies in the wafer.

In some embodiments, the target coverage region of the wafer and the location of each die in the target coverage region may be determined based on the maximum number of valid dies and the minimum number of shots to cover all the dies to determine the die layout of the wafer based on the locations of the dies. When the die layout is determined by using the maximum number of valid dies and the minimum number of shots to cover all the dies, an optimal die layout method may be obtained while ensuring the highest yield of the wafer.

When determining the target coverage region, there may be multiple target coverage regions having the same maximum number of complete dies and the same minimum number of shots. In this case, an optimal die layout may need to be determined.

In some embodiments, the optimal die layout may be determined in the following manner: determining an edge at which a complete die is located in each target coverage region, and calculating the distance between the edge at which the complete die or the valid die is located and the edge of the wafer to determine the target coverage region with the largest distance as the optimal wafer coverage region; and determining the locations of all the complete dies or locations of all the dies in the wafer in the optimal wafer coverage region, to generate the die layout.

Due to the unique characteristics of the wafer material, the closer a die to the edge of a wafer, the harder the die becomes and the more unstable its stress is, which are detrimental to die processing. Therefore, after the target coverage region of the wafer is determined, the largest distance between the complete die and the edge of the wafer may be determined. The die layout corresponding to the largest distance may be chosen as the optimal die layout.

Figure 13A:
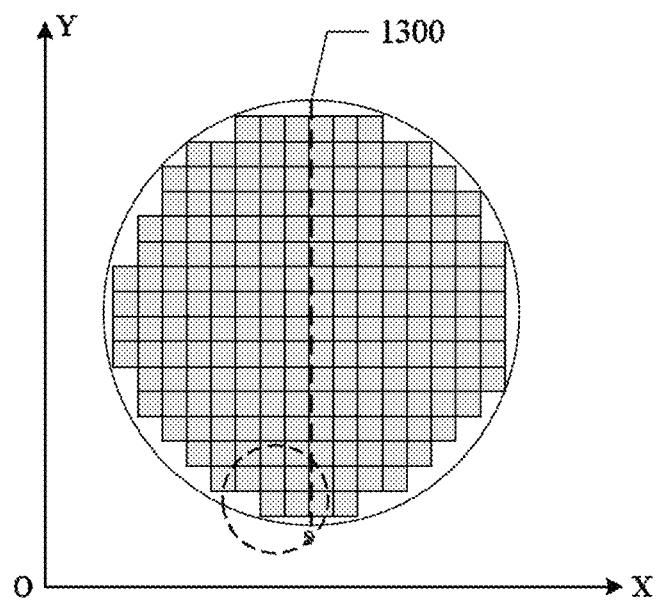
FIGS. 13A and 13B are schematic diagrams of an optimal wafer coverage region according to an embodiment of the present invention.
Figure 13B:
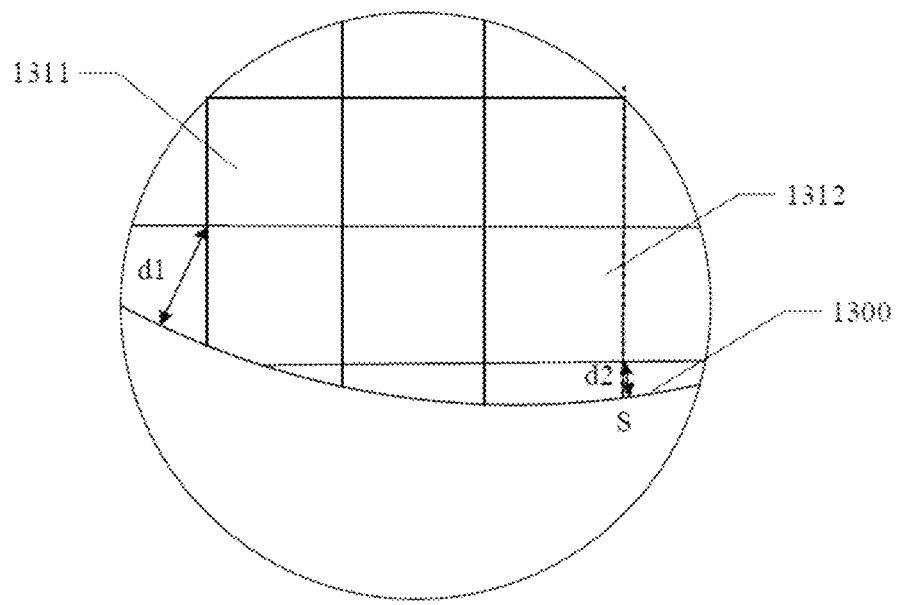

FIGS. 13A and 13B are schematic diagrams of an optimal wafer coverage region according to an embodiment of the present invention. Referring to FIG. 13A, in the target coverage region 1300, a complete die coverage region is shown by a shadow part. The edges of the complete die coverage region may be formed by the edges of complete dies located on the outermost sides. The vertical distance between each point at the edge of each complete die located on the outermost side and a tangent line of an edge of the target coverage region 1300 may be used as the spacing between the edge of the complete die and the edge of the target coverage region.

Further, the spacings may be arranged as an array based on values, and the median in the array may be determined as the minimum spacing. After the minimum spacing between the edge of the complete die in each target coverage region and the edge of the target coverage region is obtained, the target coverage region with the largest first spacing may be determined as the optimal wafer coverage region. Correspondingly, the locations of dies in the optimal wafer coverage region may constitute the optimal die layout of the wafer. The foregoing manner of determining the median as the minimum spacing based on the values of the spacings is merely exemplary illustration. Based on actual needs, the minimum spacing may be an average value of the spacings, which is not specially limited in the embodiments of the present invention.

Referring to FIG. 13B, the diameter S of the target coverage region 1300 in a direction parallel to the Y-axis may be used as a boundary. When the complete die 1311 is located at the lower left in the figure, the smallest distance d1 between the complete die 1311 and the target coverage region 1300 may be a distance equals to the radius of the target coverage region 1300 minus the distance between the center of the target coverage region 1300 and the lower left vertex of the complete die 1311. When the complete die 1312 is located at the lower right in the figure, the smallest distance d2 between the complete die 1312 and the target coverage region 1300 may be a distance equals to the radius of the target coverage region 1300 minus the distance between the center of the target coverage region 1300 and the lower right vertex of the complete die 1312.

In some embodiments, when determining the optimal die layout, the distances between the edge of the wafer and the edges at which the valid dies are located may be determined, and the die layout corresponding to a maximum value in the distances may be determined as another optimal layout. Specifically, this may be implemented in the following manner: determining the edge at which a valid die is located in each target coverage region, and calculating the distance between the edge at which the valid die is located and the edge of the wafer, to determine the target coverage region with the largest distance as the optimal wafer coverage region; and determining the locations of all the complete dies or locations of all the dies in the wafer in the optimal wafer coverage region, to generate the die layout.

Figure 14A:
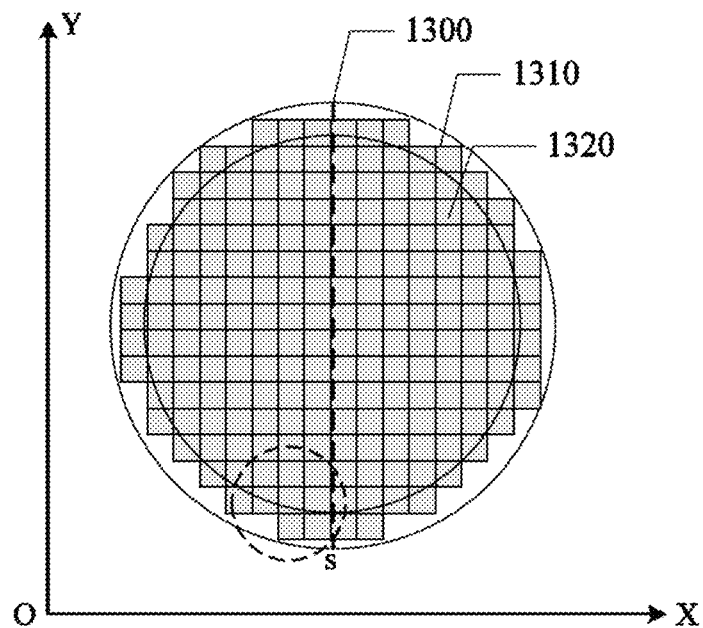
FIGS. 14A and 14B are schematic diagrams of another optimal wafer coverage region according to an embodiment of the present invention.
Figure 14B:
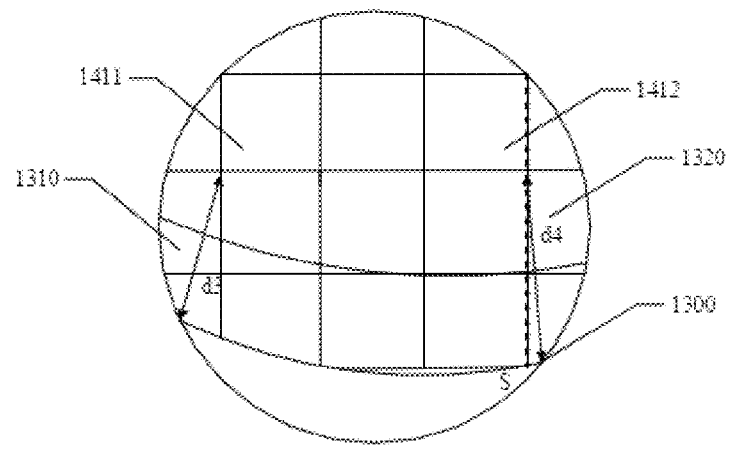

FIGS. 14A and 14B are schematic diagrams of another optimal wafer coverage region according to an embodiment of the present invention. Referring to FIG. 14A, the target coverage region 1300 may include an edge die region 1310 of the wafer and a central valid die region 1320 of the wafer. The diameter S of the target coverage region 1300 in the direction parallel to the Y-axis may be used as a boundary.

As shown in FIG. 14B, when the valid die 1411 in the central valid die region 1320 of the wafer is located at the lower left in the figure, the smallest distance d3 between the valid die 1411 and the target coverage region 1300 may be a distance equals to the radius of the target coverage region 1300 minus the distance between the center of the target coverage region and the lower left vertex of the valid die 1411. When the valid die 1412 in the central valid die region 1320 of the wafer is located at the lower right in the figure, the smallest distance d4 between the valid die 1412 and the target coverage region 1300 may be a distance equals to the radius of the target coverage region 1300 minus the distance between the center of the target coverage region 1300 and the lower right vertex of the valid die 1412.

After the distances between the edge of wafer and the edges at which the valid dies are located are obtained, the target coverage region corresponding to the largest distance may be used as the optimal wafer coverage region, and another optimal die layout of the wafer based on the locations of the dies in the optimal wafer coverage region may be generated.

According to the die layout calculation method provided in the embodiments of the present invention, the wafer center may be moved, by using one die as the reference die, in the preset region of the reference die based on the distribution array of the dies in the wafer and the first step. The number of complete dies in the first coverage region of the wafer may be determined based on the first coverage region after each movement, and the feasible region may be determined based on the number of complete dies. After the feasible region is determined, the entire feasible region may be further precisely searched based on the second step to obtain the maximum number of complete dies. After the maximum number of complete dies is determined, the reference die may be sequentially placed at different die locations in the single-shot region of the lithography device based on the die location distribution pattern in the single-shot region, to determine the minimum number of shots to cover all the dies. The locations of the dies in the wafer may be determined based on the maximum number of complete dies and the minimum number of shots to cover all the dies, to generate the die layout of the wafer.

On the one hand, the preset region of the reference die may be searched for the feasible region based on the first step, and the feasible region may be further searched for the maximum number of complete dies based on the second step, so that the accuracy of determining the maximum number of complete dies may be improved. In addition, only a partial region of the reference die may need to be searched without searching the entire reference die region, the calculation amount and time of calculating the maximum number of complete dies in the wafer may be substantially decreased, thereby improving the efficiency of generating the die layout of the wafer.

On the other hand, the die layout of the wafer may be generated based on the maximum number of complete dies and the minimum number of shots to cover all the dies, so that an optimal cutting solution for the wafer may be pre-determined. Cutting the wafer based on the optimal cutting solution provided by this invention may improve the die yield and reduce the production costs comparing with the conventional methods to cut the wafer.

Figure 15:
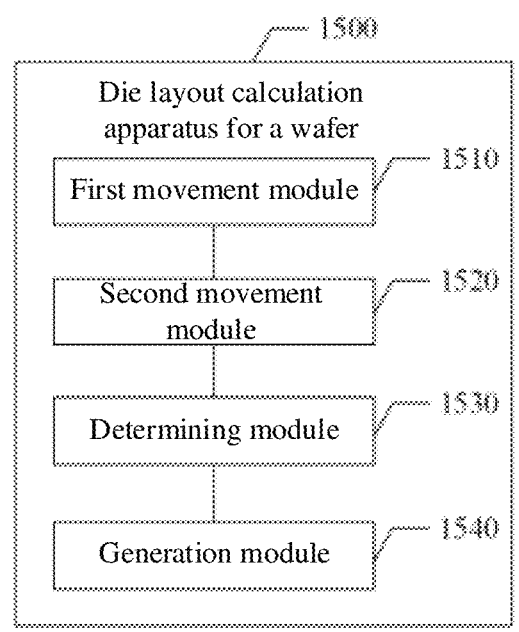
FIG. 15 is a structural block diagram of a die layout calculation apparatus for a wafer according to an embodiment of the present invention.

Based on the die layout calculation method, a die layout calculation apparatus is further provided. FIG. 15 is a structural block diagram of a die layout calculation apparatus for a wafer according to an embodiment of the present invention. Referring to FIG. 15, the die layout calculation apparatus 1500 may include: a first movement module 1510, a second movement module 1520, a determining module 1530, and a generation module 1540.

The first movement module 1510 may be configured to select, based on a distribution array of a plurality of dies in a wafer, one die of the plurality dies in the wafer as a reference die; and make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region.

The second movement module 1520 may be configured to make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the second coverage regions.

The determining module 1530 may be configured to determine a selected die location from a plurality of die locations in a single-shot region of a lithography device, the selected die location corresponding to a minimum number of shots to cover all the dies on the wafer.

The generation module 1540 may be configured to determine, based on the relative position of the wafer and the selected die location in the single-shot region, a die layout of the wafer, the die layout comprising the location for each die of the plurality of dies in the wafer.

In some embodiments, the first movement module 1510 may be further configured to determine the distribution array of the plurality of dies. The distribution array may be determined by: determining a pre-established two-dimensional coordinate system; and determining locations of the plurality of dies in the wafer based on the pre-established two-dimensional coordinate system and sizes of the dies to obtain the distribution array of the plurality of dies.

In some embodiments, to make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region, the first movement module 1510 may be further configured to: make, based on the first step, the plurality of first movements of the wafer center in the preset region of the reference die; determine, for each first movement, a test location of the wafer center, and determine the first coverage region of the wafer based on the test location of the wafer center; determine, for each first coverage region, the number of complete dies in the first coverage region; designate one or more test locations of the wafer center corresponding to a maximum number of complete dies as the designated wafer centers;

and designate a wafer region formed by the designated wafer centers as the feasible region.

In some embodiments, the preset region of the reference die may be a ¼ rectangular region of the reference die. And to make, based on a first step and the distribution array of the plurality of dies, a plurality of first movements of a wafer center in the preset region of the reference die, the first movement module 1510 may be further configured to: divide the ¼ rectangular region into a plurality of sub-regions, each sub-region being a square having a side length equal to the first step; and make the plurality of first movements of the wafer center in the plurality of sub-regions based on the first step until all the sub-regions are traversed.

In some embodiments, to designate a wafer region formed by the designated wafer centers as the feasible region, the first movement module 1510 may be further configured to: in response to the designated wafer centers located in a straight line, designate a region comprising pixels with distances to the straight line less than a preset distance as the feasible region; or in response to at least three designated wafer centers located in different straight lines, designate a maximum encircling region formed by connecting the designated wafer centers as the feasible region.

In some embodiments, to make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the plurality of dies in the second coverage regions, the second movement module 1520 may be further configured to: divide the feasible region into a plurality of grids each having a side length equal to the second step; make the plurality of second movements of the wafer center in the plurality of grids based on the second step; and determine, for each second movement, the second coverage region of the wafer based on a current location of the wafer center, and determine the relative position of the wafer center, the relative position corresponding to the maximum number of complete dies in the second coverage region.

In some embodiments, to make the plurality of second movements of the wafer center in the plurality of grids based on the second step, the second movement module 1520 may be further configured to: determine one grid of the plurality of grids in the feasible region as an initial location of the wafer center, and make the second movements of the wafer center in a clockwise direction or a counterclockwise direction in the plurality of grids based on the second step; and after each second movement: determine the second coverage region based on the current location of the wafer center, and determine a current number of complete dies in the second coverage region; compare the current number of completed dies with an initial number of completed dies corresponding to the initial location of the wafer center; and in response to the current number of completed dies larger than or equal to the initial number of completed dies, designate the grid corresponding to the current number of completed dies as the initial location of the wafer center.

Another aspect of this invention is directed to a computer-readable storage medium. The medium may store a computer program executable by a processor. Upon being executed by a processor, the computer program may cause the processor to perform any of the foregoing die layout calculation methods for a wafer.

Specific details of the modules in the apparatus are described in detail in the implementation in the method part. For undisclosed solution details, reference may be made to the content in the implementation in the method part. Therefore, details are not described again.

A person skilled in the art can understand that each aspect of this invention may be implemented as a system, method, or program product. Therefore, each aspect of this invention may be specifically implemented in the form of a hardware-only implementation, a software-only implementation (including firmware, micro code, or the like), or implementation with a combination of hardware and software, which may be collectively referred to as a "circuit", "module", or "system" herein.

A computer-readable storage medium is further provided. The computer-readable storage medium may store a program product that can implement the foregoing methods provided in the specification. In some embodiments, each aspect of this invention may be implemented in the form of a program product, and the program product may include program code. When the program product is run on a terminal device, the program code may be used to enable the terminal device to perform the steps according to various embodiments of this invention that are described in the specification.

Figure 16:
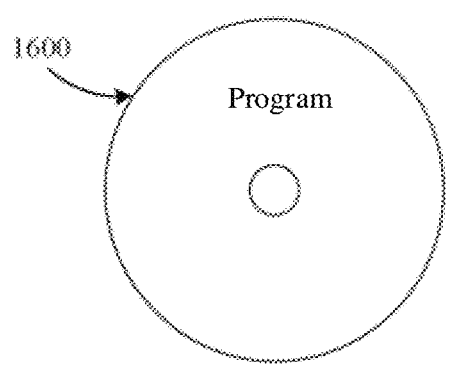
FIG. 16 shows a computer-readable storage medium for implementing the foregoing method according to an embodiment of the present invention.

FIG. 16 shows a program product 1600 for implementing the foregoing method according to an embodiment of the present invention. Referring to FIG. 16, the program product 1600 may be a portable compact disk read-only memory (CD-ROM) and may include program code, and may be run on a terminal device, such as a personal computer. However, the program product provided in this invention is not limited thereto. In this invention, a readable storage medium may be any tangible medium including or storing a program, and the program may be used by or used in combination with an instruction execution system, apparatus, or device.

The program product 1600 may be any combination of one or more readable media. The readable medium may be a readable signal medium or a readable storage medium. For example, the readable storage medium may be but is not limited to an electrical, magnetic, optical, electromagnetic, infrared, or semiconductor system, apparatus, or device, or any combination thereof. More specific examples (which do not constitute an exhaustive list) of the readable storage medium may include an electrical connection with one or more wires, a portable disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination thereof.

The computer-readable signal medium may include a data signal in a baseband or propagated as a part of a carrier, and may carry readable program code. The propagated data signal may be in a plurality of forms, including but not limited to an electromagnetic signal, an optical signal, or any suitable combination thereof. The readable signal medium may be alternatively any readable medium other than the readable storage medium, and the readable medium may send, propagate, or transmit a program used by or used in combination with an instruction execution system, apparatus, or device.

The program code included in the readable medium may be transmitted by any suitable medium, including but not limited to a wireless, wired, optical cable, or RF manner, or any suitable combination thereof.

Program code for performing the operations of this invention may be written in any combination of one or more programming languages. The programming languages include an object-oriented programming language such as Java or C++, and further include a conventional procedural programming language such as the "C" language or a programming language similar to this. The program code may be completely executed on a user computing device, partially executed on user equipment, executed as an independent software package, partially executed on a user computing device and partially executed on a remote computing device, or completely executed on a remote computing device or server. In a case involving a remote computing device, the remote computing device may be connected to a user computing device by using any type of network, including a local area network (LAN) or a wide area network (WAN); or may be connected to an external computing device (for example, connected to the external computing device by using the Internet provided by an Internet service provider).

Figure 17:
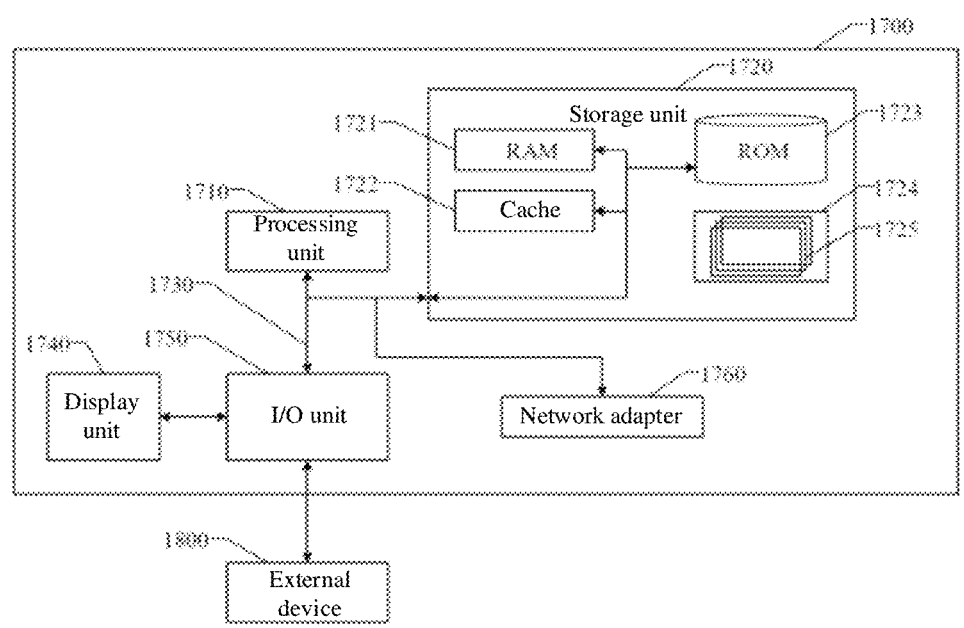
FIG. 17 shows an electronic device for implementing the foregoing method according to an embodiment of the present invention.

An electronic device that can implement the foregoing methods is further provided. FIG. 17 shows an electronic device for implementing the foregoing method according to an embodiment of the present invention. The electronic device 1700 shown in FIG. 17 is merely an example, and does not intend to constitute any limitation on a function and a use scope of the implementation of this invention.

As shown in FIG. 17, the electronic device 1700 may be represented in the form of a general computing device. Components of the electronic device 1700 may include but are not limited to at least one processing unit 1710, at least one storage unit 1720, a bus 1730 connecting different system components (including the storage unit 1720 and the processing unit 1710), and a display unit 1740.

The storage unit 1720 may store program code, and the program code may be executed by the processing unit 1710, so that the processing unit 1710 may perform the steps according to various embodiments of this invention that are described in the specification. For example, the processing unit 1710 may perform the method steps shown in FIG. 1, FIG. 3, and FIG. 7.

The storage unit 1720 may include a readable medium in the form of a volatile storage unit, such as a random access memory (RAM) 1721 and/or a cache 1722, and may further include a read-only memory (ROM) 1723. The storage unit 1720 may further include a program/utility tool 1724 having a group (at least one) of program modules 1725. Such program modules 1725 may include but are not limited to an operating system, one or more application programs, another program module, and program data. Each or a combination of these examples may include the implementation of a network environment.

The bus 1730 may be one or more of buses indicating several types of bus structures, including a storage unit bus or a storage unit controller, a peripheral bus, a graphics acceleration port, a processing unit, or a local bus that uses any of a plurality of bus structures.

The electronic device 1700 may also communicate with one or more external devices 1800 (such as a keyboard, a pointing device, or a Bluetooth device), or may communicate with one or more devices that enable a user to interact with the electronic device 1700, and/or communicate with any device (such as a router or a modem) that enables the electronic device 1700 to communicate with one or more other computing devices. Such communication may be performed through an input/output (I/O) interface 1750. In addition, the electronic device 1700 may further communicate with one or more networks (such as a local area network (LAN), a wide area network (WAN), and/or a public network such as the Internet) by using a network adapter 1760. As shown in the figure, the network adapter 1760 may communicate with another module of the electronic device 1700 through the bus 1730. Although not shown in the figure, another hardware and/or software module may be used in combination with the electronic device 1700, including but not limited to microcode, a device drive, a redundancy processing unit, an external disk drive array, a RAID system, a tape drive, a data backup storage system, and the like.

Although several modules or units of the device for performing actions are mentioned in the foregoing detailed description, such division is not mandatory. In reality, according to the embodiments of this invention, the features and functions of two or more modules or units described above may be embodied in one module or unit. On the contrary, the feature and function of one module or unit described above may be further divided for implementation by a plurality of modules or units.

In addition, the accompanying drawings are merely exemplary description of the processing included in the methods according to the embodiments of this invention, which do not intend to constitute a limitation. The processing shown in the accompanying drawings does not indicate or limit a time sequence of the processing. In addition, the processing may be, for example, performed synchronously or asynchronously in a plurality of modules.

A person skilled in the art may readily understand through the description of the embodiments that the embodiments described herein may be implemented by software, or may be implemented by software in combination with necessary hardware. Therefore, the technical solutions according to the embodiments of this invention may be implemented in the form of a software product. The software product may be stored in a non-volatile storage medium (which may be a CD-ROM, a USB flash drive, or a removable hard disk) or a network, and may include several instructions for instructing a computing device (which may be a personal computer, a server, a terminal apparatus, a network device, or the like) to perform the methods in the embodiments of this invention.

A person skilled in the art can easily figure out other implementations of this invention after considering the specification and practicing the present invention disclosed herein. This invention is intended to cover any variations, functions, or adaptive changes of this invention. These variations, functions, or adaptive changes comply with general principles of this invention, and include common knowledge or a commonly used technical means in the technical field that is not disclosed in this invention. The specification and the implementations are merely considered as examples, and the actual scope and spirit of this invention are specified in the claims.

What is claimed is:

1. A die layout calculation method, comprising:
   selecting, based on a distribution array of a plurality of dies in a wafer, one die as a reference die;
   making, based on a first step and the distribution array of the plurality of dies, a plurality of first movements of a wafer center in a preset region of the reference die to determine a first coverage region of the wafer for each first movement, and determining a feasible region of the reference die based on a number of complete dies in the plurality of dies in each first coverage region;

making, based on a second step, a plurality of second movements of the wafer center in the feasible region to determine a second coverage region of the wafer for each second movement, and determining, based on the second coverage regions, a relative position of the wafer center in the reference die, the relative position corresponding to a maximum number of complete dies in the second coverage regions;

determining a selected die location from a plurality of adjacent die locations in a single-shot region of a lithography device, the selected die location corresponding to a minimum number of shots to cover all the dies on the wafer; and determining, based on the relative position of the wafer center and the selected die location in the single-shot region, a die layout of the wafer, the die layout comprising a location for each die of the plurality of dies in the wafer.

2. The method of claim 1, wherein determining a selected die location from a plurality of adjacent die locations in a single-shot region comprises:

determining, for each of the die locations in the single-shot region, a tentative number of shots to cover all the dies on the wafer; and selecting the die location with the smallest tentative number of shot as the selected die location.

3. The method of claim 1, further comprising, determining the distribution array of the plurality of dies by:

determining a pre-established two-dimensional coordinate system; and determining locations of the plurality of dies in the wafer based on the pre-established two-dimensional coordinate system and sizes of the dies to obtain the distribution array of the plurality of dies.

4. The method of claim 1, wherein making, based on a first step and the distribution array of the plurality of dies, a plurality of first movements of a wafer center in a preset region of the reference die to determine a first coverage region of the wafer for each first movement, and determining a feasible region of the reference die based on a number of complete dies in the plurality of dies in each first coverage region comprises:

making, based on the first step, the plurality of first movements of the wafer center in the preset region of the reference die;

determining, for each first movement, a test location of the wafer center, and determining the first coverage region of the wafer based on the test location of the wafer center;

determining, for each first coverage region, the number of complete dies in the first coverage region;

designating one or more test locations of the wafer center corresponding to a maximum number of complete dies as the designated wafer centers; and designating a wafer region formed by the designated wafer centers as the feasible region.

5. The method of claim 4, wherein designating a wafer region formed by the designated wafer centers as the feasible region comprises:

in response to the designated wafer centers located in a straight line, designating a region comprising pixels with distances to the straight line less than a preset distance as the feasible region; or in response to at least three designated wafer centers located in different straight lines, designating a maximum encircling region formed by connecting the designated wafer centers as the feasible region.

6. The method of claim 1, wherein the preset region of the reference die is a ¼ rectangular region of the reference die, and wherein making, based on a first step and the distribution array of the plurality of dies, a plurality of first movements of a wafer center in the preset region of the reference die comprises:

dividing the ¼ rectangular region into a plurality of sub-regions, each sub-region being a square having a side length equal to the first step; and making the plurality of first movements of the wafer center in the plurality of sub-regions based on the first step until all the sub-regions are traversed.

7. The method of claim 1, wherein making, based on a second step, a plurality of second movements of the wafer center in the feasible region to determine a second coverage region of the wafer for each second movement, and determining, based on the second coverage regions, a relative position of the wafer center in the reference die, the relative position corresponding to a maximum number of complete dies in the second coverage regions comprises:

dividing the feasible region into a plurality of grids each having a side length equal to the second step;

making the plurality of second movements of the wafer center in the plurality of grids based on the second step; and determining, for each second movement, the second coverage region of the wafer based on a current location of the wafer center, and determining the relative position of the wafer center, the relative position corresponding to the maximum number of complete dies in the second coverage region.

8. The method of claim 7, wherein making the plurality of second movements of the wafer center in the plurality of grids based on the second step comprises:

determining one grid of the plurality of grids in the feasible region as an initial location of the wafer center, and making the second movements of the wafer center in a clockwise direction or a counterclockwise direction in the plurality of grids based on the second step; and after each second movement:

determining the second coverage region based on the current location of the wafer center, and determining a current number of complete dies in the second coverage region;

comparing the current number of completed dies with an initial number of completed dies corresponding to the initial location of the wafer center; and in response to the current number of completed dies larger than or equal to the initial number of completed dies, designating the grid corresponding to the current number of completed dies as the initial location of the wafer center.

9. The method of any one of claim 1, further comprising, after determining the relative position of the wafer center in the reference die:

determining valid dies in the complete dies;

determining a die coverage region for the valid dies;

determining, in the die coverage region, a number of valid edge dies and a number of valid non-edge dies in the valid dies; and determining a maximum number of valid dies, wherein the maximum number of valid dies is a sum of the number of valid non-edge dies and a product of the number of valid edge dies with a preset constant.

10. The method of claim 9, wherein determining, based on the relative position of the wafer center and the selected die location in the single-shot region, a die layout of the wafer comprises:

determining a target coverage region of the wafer and a location of each die in the target coverage region based on the maximum number of complete dies and the minimum number of shots to generate the die layout; or determining a target coverage region of the wafer and a location of each die in the target coverage region based on the maximum number of valid dies and the minimum number of shots to generate the die layout.

11. The method of claim 10, wherein there are a plurality of target coverage regions, and the method further comprises:

determining, for each target coverage region, a regional edge at which a complete die or a valid die is located in each target coverage region;

comparing, for each target coverage region, a distance between the regional edge and a wafer edge, to determine a largest distance between the regional edge and the wafer edge;

determining the target coverage region corresponding to the largest distance as an optimal wafer coverage region; and determining locations of all the complete dies or locations of all the dies in the wafer in the optimal wafer coverage region to generate the die layout.

12. A non-transitory computer-readable storage medium, wherein the non-transitory computer-readable storage medium stores a computer program executable by a processor, where upon being executed by the processor, the computer program causes the processor to perform the method of claim 1.

13. An electronic device, comprising:
a processor; and
a memory, configured to store an executable instruction of the processor, wherein
the processor is configured to perform the method of claim 1 by executing the executable instruction.

14. A die layout calculation apparatus, comprising:
a first movement module, configured to:
select, based on a distribution array of a plurality of dies in a wafer, one die as a reference die; and
make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region;
a second movement module, configured to:
make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the second coverage regions;
a determining module, configured to:
determine a selected die location from a plurality of die locations in a single-shot region, the selected die location corresponding to a minimum number of shots to cover all the dies on the wafer; and
a generation module, configured to:
determine, based on the relative position of the wafer and the selected die location in the single-shot region, a die layout of the wafer, the die layout comprising a location for each die of the plurality of dies in the wafer.

15. The apparatus of claim 14, wherein to determine a selected die location from a plurality of adjacent die locations in a single-shot region, the determining module is further configured to:

determine, for each of the die locations in the single-shot region, a tentative number of shots to cover all the dies on the wafer; and select the die location with the smallest tentative number of shot as the selected die location.

16. The apparatus of claim 14, wherein the first movement module is further configured to:

determine the distribution array of the plurality of dies by:
determining a pre-established two-dimensional coordinate system; and
determining locations of the plurality of dies in the wafer based on the pre-established two-dimensional coordinate system and sizes of the dies to obtain the distribution array of the plurality of dies.

17. The apparatus of claim 14, wherein to make, based on a first step and the distribution array of the plurality dies, a plurality of first movements of a wafer center in a preset region of the reference die to determine a first coverage region of the wafer for each first movement, and determine a feasible region of the reference die based on a number of complete dies in the plurality of dies in each first coverage region, the first movement module is further configured to:

make, based on the first step, the plurality of first movements of the wafer center in the preset region of the reference die;

determine, for each first movement, a test location of the wafer center, and determine the first coverage region of the wafer based on the test location of the wafer center;

determine, for each first coverage region, the number of complete dies in the first coverage region;

designate one or more test locations of the wafer center corresponding to a maximum number of complete dies as the designated wafer centers; and designate a wafer region formed by the designated wafer centers as the feasible region.

18. The apparatus of claim 17, wherein to designate a wafer region formed by the designated wafer centers as the feasible region, the first movement module is further configured to:

in response to the designated wafer centers located in a straight line, designate a region comprising pixels with distances to the straight line less than a preset distance as the feasible region; or in response to at least three designated wafer centers located in different straight lines, designate a maximum encircling region formed by connecting the designated wafer centers as the feasible region.

19. The apparatus of claim 14, wherein the preset region of the reference die is a ¼ rectangular region of the reference die, and wherein to make, based on a first step and the distribution array of the plurality of dies, a plurality of first movements of a wafer center in the preset region of the reference die, the first movement module is further configured to:

divide the ¼ rectangular region into a plurality of sub-regions, each sub-region being a square having a side length equal to the first step; and make the plurality of first movements of the wafer center in the plurality of sub-regions based on the first step until all the sub-regions are traversed.

20. The apparatus of claim 14, wherein to make, based on a second step, a plurality of second movements of the wafer center in the feasible region to determine a second coverage region of the wafer for each second movement, and determine, based on the second coverage regions, a relative position of the wafer center in the reference die, the relative position corresponding to a maximum number of complete dies in the second coverage regions, the second movement module is further configured to:

divide the feasible region into a plurality of grids each having a side length equal to the second step;

make the plurality of second movements of the wafer center in the plurality of grids based on the second step; and determine, for each second movement, the second coverage region of the wafer based on a current location of the wafer center, and determine the relative position of the wafer center, the relative position corresponding to the maximum number of complete dies in the second coverage region.

* * * * *